(12) United States Patent
Hieb

(10) Patent No.: US 11,158,396 B2
(45) Date of Patent: *Oct. 26, 2021

(54) DATA REDIRECTION UPON FAILURE OF A PROGRAM OPERATION

(71) Applicant: Micron Technology, Inc., Boise, ID (US)

(72) Inventor: Adam J. Hieb, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/091,252

(22) Filed: Nov. 6, 2020

(65) Prior Publication Data

US 2021/0065840 A1 Mar. 4, 2021

Related U.S. Application Data

(63) Continuation of application No. 16/553,555, filed on Aug. 28, 2019, now Pat. No. 10,854,311.

(51) Int. Cl.
| | |
|---|---|
| *G11C 11/16* | (2006.01) |
| *G11C 29/00* | (2006.01) |
| *G11C 11/4093* | (2006.01) |
| *G06F 13/16* | (2006.01) |
| *G06F 3/06* | (2006.01) |

(52) U.S. Cl.
CPC .......... *G11C 29/848* (2013.01); *G06F 3/0619* (2013.01); *G06F 3/0646* (2013.01); *G06F 3/0679* (2013.01); *G06F 13/1673* (2013.01); *G11C 11/4093* (2013.01)

(58) Field of Classification Search
CPC . G11C 13/0002; G11C 13/0033; G11C 11/16; G11C 13/0035; G11C 13/004; G11C 13/0061; G11C 13/0069; G11C 2213/71; G11C 2213/77; G11C 5/005; G11C 5/02; G11C 16/3431; G11C 7/04; G11C 5/148
See application file for complete search history.

(56) References Cited

U.S. PATENT DOCUMENTS

| | | | |
|---|---|---|---|
| 9,710,226 B1 | 7/2017 | Zheng et al. | |
| 10,854,311 B1 * | 12/2020 | Hieb | G06F 3/0679 |
| 2005/0141312 A1 | 6/2005 | Sinclair | |
| 2006/0158951 A1 | 7/2006 | Kim | |
| 2009/0187700 A1 | 7/2009 | Kern et al. | |
| 2012/0059981 A1 | 3/2012 | Flynn et al. | |

(Continued)

OTHER PUBLICATIONS

International Search Report and Written Opinion from related international application No. PCT/US2020/047769, dated Dec. 3, 2020, 11 pages.

*Primary Examiner* — Hien N Nguyen
(74) *Attorney, Agent, or Firm* — Brooks, Cameron & Huebsch, PLLC

(57) ABSTRACT

A determination is made by a processing device included in a memory component that an operation to program data to a location in the memory component has failed, the data is programmed to a different location in the memory component by the processing device upon determining the operation has failed, and a notification that the data has been programmed to the different location in the memory component is provided by the processing device to a processing device operatively coupled to the memory component.

20 Claims, 3 Drawing Sheets

(56) References Cited

U.S. PATENT DOCUMENTS

2016/0210050 A1 7/2016 Hyun
2017/0116083 A1 4/2017 Park et al.
2017/0123991 A1 5/2017 Sela et al.
2018/0188954 A1 7/2018 Chu

* cited by examiner

DATA REDIRECTION UPON FAILURE OF A PROGRAM OPERATION

PRIORITY INFORMATION

This application is a Continuation of U.S. application Ser. No. 16/553,555, filed on Aug. 28, 2019, the contents of which are incorporated herein by reference.

TECHNICAL FIELD

Embodiments of the disclosure relate generally to memory sub-systems, and more specifically, relate to data redirection upon failure of a program operation.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
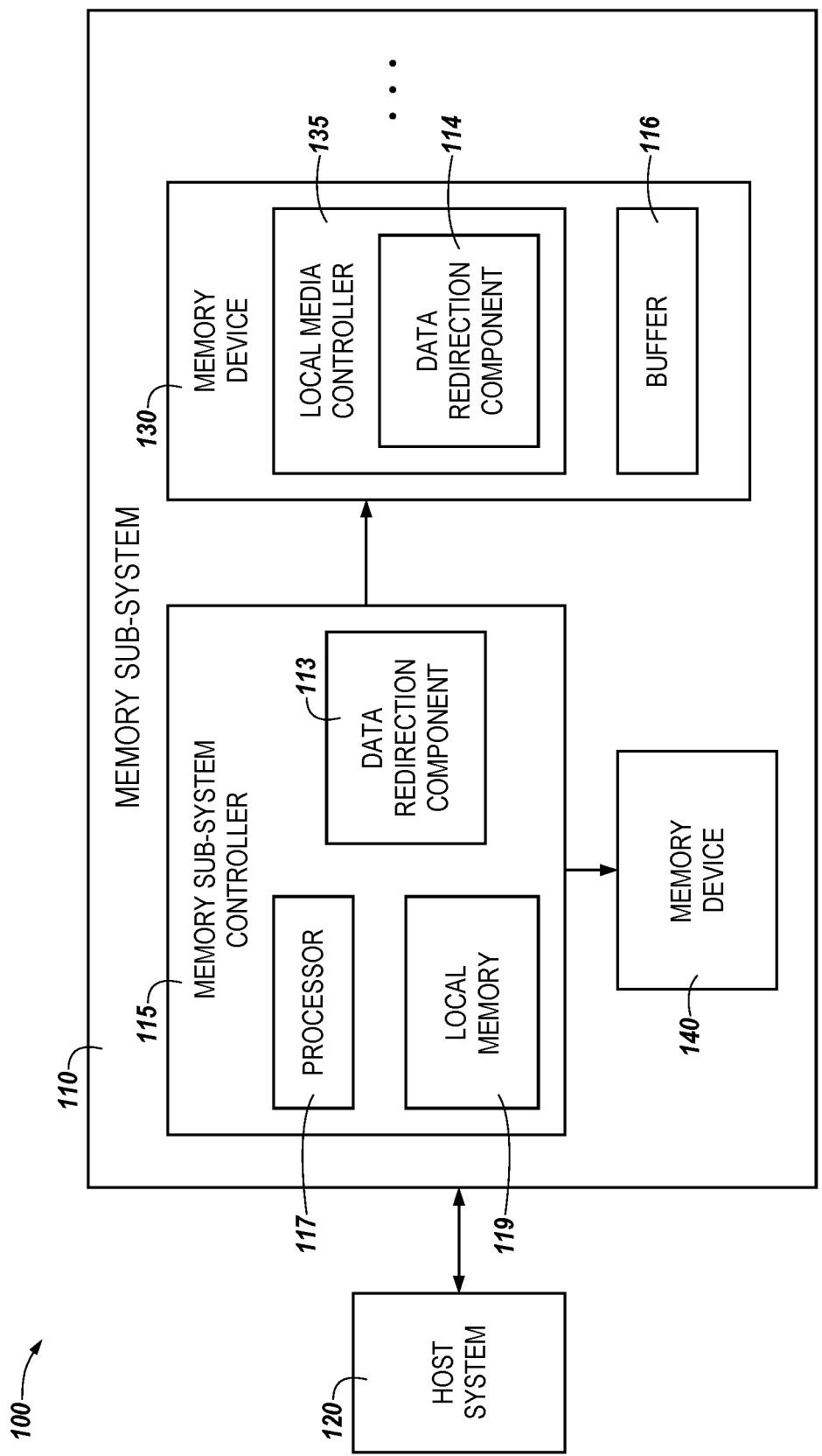
FIG. 1 illustrates an example computing environment that includes a memory sub-system in accordance with some embodiments of the present disclosure.

Aspects of the present disclosure are directed to data redirection upon failure of a program operation. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

Operation of a memory sub-system can include programming data (e.g., data provided by a host system) to a memory component of the memory sub-system for storage at the memory component. However, a number of defects and/or errors may occur before and/or during such a program operation, which can cause the program operation to fail (e.g., cause the data to not be successfully programmed to the memory component), which can result in the data being lost. "Programming", "program", and "program operation" hereinafter refers to writing data to a memory component (e.g., memory device) to store data at the memory component.

Conventional memory sub-systems can protect against data loss caused by program failures using a variety of conventional data protection and/or recovery schemes, such as, for example, a redundant array of independent NAND (RAIN) data protection and recovery scheme and/or a claw back (e.g., NAND claw back) data protection and recovery scheme. A RAIN data protection and recovery scheme can divide and/or replicate the data being programmed to the memory sub-systems among multiple memory devices. For instance, a RAIN data protection and recovery scheme can divide and/or replicate the data across a stripe of memory devices, and subsequently recover lost data using the data in the stripe. A claw back data protection and recovery scheme can involve recovering (e.g., clawing back) lost data from a cache of the memory sub-system that was used for the program operation, and storing the data recovered from the cache in buffers of the memory sub-system.

Such conventional data protection and/or recovery schemes (e.g., RAIN and claw back schemes) can be managed and performed at the host and/or memory sub-system controller level. For example, in a conventional RAIN or claw back scheme, the data being recovered (e.g., the data that was attempted to be programmed to the memory component during the program operation) must be processed and moved through the controller of the memory sub-system. However, processing and moving the data through the controller of the memory sub-system can increase (e.g., extend) the amount of time needed to recover the data and/or increase the amount of memory sub-system resources used to recover the data, which can adversely affect the performance of the host system and/or memory sub-system. Further, the memory sub-system controller may need to interrupt other commands (e.g., commands associated with other operations) being performed and/or executed by the memory sub-system controller with an additional command in order to recover the data using a conventional RAIN or claw back scheme, which can further adversely affect the performance of the host system and/or memory sub-system. Further, a conventional RAIN scheme can have many permutations, and can only be used to protect against data loss caused by certain defects or device operation limitation, which can increase the chances of the data being unable to be recovered.

Aspects of the present disclosure address the above and other deficiencies by managing and performing the recovery of (e.g., redirecting and/or re-programming) data from a failed program operation (e.g., data that was not successfully programmed to a memory component but remains in the buffer of the component) at the memory component level, rather than at the memory sub-system controller or host level. For example, aspects of the present disclosure do not process or move the data being recovered through the memory sub-system controller. Rather, the data can be recovered by utilizing a local controller and buffer of the memory component.

As such, aspects of the present disclosure can increase the performance of the host system and/or memory sub-system as compared to conventional approaches. For example, aspects of the present disclosure can reduce the amount of time needed to recover data from a failed program operation as compared to conventional approaches that utilize a conventional RAIN or claw back scheme to recover such data, and can recover the data without utilizing resources of the memory sub-system. Further, aspects of the present disclosure can recover the data without other commands being performed and/or executed by the memory sub-system controller being interrupted with an additional command. Further, aspects of the present disclosure can recover data lost due to any type of program defect or device operation limitation.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory components 130 can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion, and an MLC portion, TLC portion, or a QLC portion of memory cells. Each of the memory cells can store one or more bits of data used by the host system 120. Furthermore, the memory cells of the memory devices 130 can be grouped to form pages that can refer to a unit of the memory component used to store data. With some types of memory (e.g., NAND), pages can be grouped to form blocks.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory device 130.

The local media controller 135 includes a data redirection component 114 that can be used, with buffer 116 of memory device 130, to redirect data upon a failure of a program operation. In some embodiments, the local media controller 135 includes at least a portion of data redirection component 113. For example, the local media controller 135 can include a processor (processing device) configured to execute instructions stored in a local memory for performing the operations described herein. In some embodiments, the data redirection component 114 is part of the host system 120, an application, or an operating system.

Data redirection component 114 and buffer 116 can be used by memory device 130 to redirect data from a failed program operation (e.g., data that was not successfully programmed to its intended location in memory device 130) to a different location in memory device 130 without processing or moving the data through the memory sub-system controller 115. Further, data redirection component 114 and buffer 116 can be used by memory device 130 to redirect the data without interrupting other commands being performed and/or executed by the memory sub-system controller 115 on memory device 130 with an additional command. Further details with regards to the operations of the data redirection component 114 and buffer 116 are described below.

For example, memory sub-system 110 (e.g., controller 115) can receive, from host system 120, a command (e.g., a write command) to program (e.g., write) data to a particular location in memory device 130. The location can be, for example, a particular physical location in memory device 130, such as, for instance, a particular physical page(s) or block(s) of memory cells in memory device 130.

In response to receiving the command, memory sub-system controller 115 can initiate and perform an operation (e.g., a write operation) to program the data to the location in memory device 130. For instance, memory sub-system controller 115 can send the data to memory device 130 for programming (e.g., local media controller 135 can receive the data from memory sub-system controller 115). The data to be programmed can also be stored in buffer 116 during the program operation.

In some instances, however, the operation to program the data to the location in memory device 130 may fail. For instance, some or all of the data may not be successfully programmed to the location in memory device 130. The program operation may fail due to, for instance, defects in the memory cells at the location in memory device 130, device operation limitation such as supplied power, noise, and/or cell wear, or a failure of coupled access (e.g. word) lines at the location in memory device 130, among other causes.

If the program operation fails, data redirection component 114 can determine that the failure has occurred (e.g., that some or all of the data has not been successfully programmed). For example, data redirection component 114 can receive an indication, such as, for instance, a status indicator and/or flag, that the program operation has failed from data redirection component 113 of memory sub-system controller 115. For instance, in the case of a coupled access line failure, data redirection component 113 can perform a scan (e.g., a pre-read scan) for access lines that could potentially fail before the program operation is initiated, and provide an indication of a detected coupled access line failure to data redirection component 114.

Upon determining the program operation has failed, data redirection component 114 can program (e.g., redirect) the data to a different location in memory device 130 (e.g., to a different location than the location included in the command to program the data). For instance, data redirection component 114 can retrieve the data from buffer 116, and program the retrieved data to the different location. The different location can be, for example, a different physical location in memory device 130, such as, for instance, a different physical page(s) or block(s) of memory cells in memory device 130.

In some examples, the different location to which the data is programmed can be determined by data redirection component 114. For example, data redirection component 114 can determine the different location upon determining the program operation has failed (e.g., on the fly). In such examples, the different location to which the data is programmed (e.g., redirected) would not be known to memory sub-system controller 115 prior to the program operation. Data redirection component 114 can determine the different location based on the current operating parameters and/or storage characteristics of memory device 130, for instance.

In some examples, data redirection component 114 can receive an indication of (e.g., a pointer to) the different location from data redirection component 113 of memory sub-system controller 115. For example, the different location can a pre-determined location, such as a default location determined prior to initiating the program operation, in memory device 130. For instance, the different location can be a spare area in memory device 130. In such examples, the different location to which the data is programmed can be determined (e.g., set), and therefore known, by data redirection component 113 prior to the program operation. This location could also be changed (e.g., updated) by data redirection component 113 during operation of memory sub-system 110.

The size of the different location to which the data is programmed can correspond to the size of (e.g., amount of data that can be stored by) the buffer 116, so that the different location has enough space for the data in the buffer to be redirected to. This size can depend on the page size, number of bits per memory cell, and/or number of planes of memory device 130. As an example, the size of the buffer 116 can be 16 kilobytes (kB) by 3 pages by 4 planes. However, embodiments of the present disclosure are not limited to this example, and the size of the buffer may depend on the type (e.g., NAND type) of memory device 130. For instance, the size could be 4, 8, or 16 kB by 3 pages (e.g., for TLC) or 4 pages (e.g., for QLC) by 1 to 4 planes.

As such, the data can be programmed (e.g., redirected) to the different location in memory device 130 without moving or processing the data back through memory sub-system controller 115. For instance, the data can be programmed to the different location without using a RAIN or claw back scheme. Further, the data can be programmed to the different location in memory device 130 without commands associated with other operations being performed by memory sub-system controller 115, such as, for instance, new commands that have been received from host system 120 and begun to be executed by memory sub-system 115 after the program operation has been initiated, being interrupted by an additional command. For example, the commands associated with the other operations may be interrupted to point to a new location in memory device 130 (e.g., as a result the data being programmed to the different location in memory device 130), but the commands would not have to have a new command placed in front of them. Further, data redirection component 114 can automatically redirect subsequent operations that attempt to program data to the location of the failed program operation to the different location in memory device 130. For instance, upon receiving a subsequent command to program additional data to the location of the failed program operation, data redirection component 114 can instead program that additional data to the different location in memory device 130.

Upon programing (e.g., redirecting) the data to the different location in memory device 130, data redirection component 114 can provide a notification to data redirection component 113 of memory sub-system controller 115 indicating that the data has been programmed to the different location. Data redirection component 113 can process that the data has been programmed to the different location in memory device 130 in response to receiving the notification. For instance, data redirection component 113 can update the settings and/or parameters of memory sub-system controller 115 to reflect that the data has been programmed to the different location. Accordingly, when performing a subsequent operation to sense (e.g., read) the data, memory sub-system controller 115 can sense (e.g., know to sense) the data from the different location in memory device 130, rather than from its originally intended location included in the program command from host system 120.

In some examples, the notification can include an indication of (e.g., a pointer to) the different location to which the data is programmed. For instance, the notification can include such an indication in examples in which the different location is determined by data redirection component 114 (e.g., because the different location would not be known to memory sub-system controller 115 prior to the program operation).

In some examples, the notification would not need to include an indication of the different location to which the data is programmed. For instance, the notification would not need to include such an indication in examples in which the different location is determined (e.g. set) by data redirection component 113 of memory sub-system controller 115 (e.g., because the different location would already be known to memory sub-system controller 115).

After the data has been programmed to the different location in memory device 130, and the notification of the data being programmed to the different location has been provided to data redirection component 113, a subsequent operation to program data to memory device 130 can be initiated by memory sub-system controller 115. For instance, memory sub-system controller 115 can initiate the subsequent (e.g. next) program operation to execute another (e.g., the next) program command received from host system 120.

In some examples, upon the subsequent program operation being initiated, the data from the previous program operation (e.g., the data that was previously redirected to the different location in memory device 130) can be erased from buffer 116, and the new data to be programmed to memory device 130 by the subsequent program operation can be stored in buffer 116. In such an example, buffer 116 can be in first pass programming mode, in which data from a program operation is stored (e.g. exists) in the buffer until the next program operation, at which point the buffer is erased so that the buffer can be reused for the next program operation.

In some examples, a portion of the data from the previous program operation, such as, for instance, at least a page of the data from the previous program operation, can continue to be stored in (e.g., may not be erased from) buffer 116 during the subsequent program operation. In such an example, buffer 116 can be in second pass programming mode, in which a portion (e.g., page(s)) of data from a previous program operation, such as, for instance, a first pass program operation, is also used for the next (e.g., second pass) program operation. As an additional example, buffer 116 can be in third pass programming mode, in which a portion of data from the second pass program operation is also used for the third pass program operation, such as, for instance, for a QLC device.

If the subsequent program operation fails, data redirection component 114 can determine that the failure has occurred, program (e.g., redirect) the data to a different location in memory device 130, and provide a notification to data redirection component 113 that the data has been programmed to the different location, as previously described herein. Data redirection component 114 can continue to redirect data from failed program operations in such a manner during subsequent operation (e.g., throughout the lifetime) of memory subsystem 110.

Figure 2:
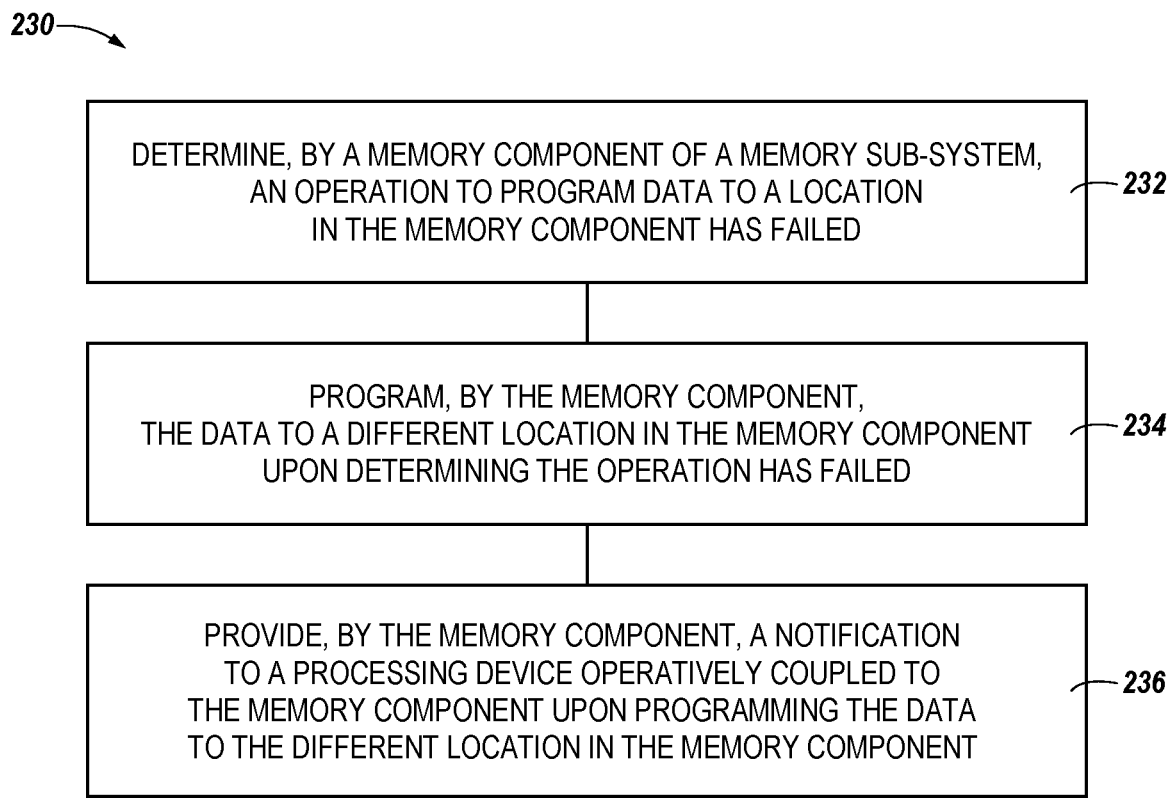
FIG. 2 is a flow diagram of an example method to redirect data upon failure of a program operation in accordance with some embodiments of the present disclosure.

FIG. 2 is a flow diagram of an example method 230 to redirect data upon failure of a program operation in accordance with some embodiments of the present disclosure. The method 230 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 230 is performed by data redirection component 114 of memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 232, a memory component of a memory sub-system determines that an operation to program data to a location in the memory component has failed. The memory component and memory sub-system can be, for example, memory device 130 and memory sub-system 110, respectively, of FIG. 1. The location in the memory component can be a physical location in the memory component, as previously described in connection with FIG. 1. The memory component can determine that the program operation has failed by, for example, receiving an indication of the failure from the controller of the memory sub-system (e.g., controller 115), as previously described in connection with FIG. 1.

At operation 234, the memory component programs the data to a different location in the memory component upon determining that the program operation has failed. The different location in the memory component can be a different physical location in the memory component, and can be determined by the memory component or the controller of the memory sub-system, as previously described in connection with FIG. 1. The memory component can program the data to the different location by, for example, retrieving the data from a buffer of the memory component (e.g., buffer 116), as previously described in connection with FIG. 1. Further, the memory component can program the data to the different location without moving or processing the data through the controller of the memory sub-system, and without commands associated with other operations being performed by the controller of the memory sub-system being interrupted by an additional command, as previously described in connection with FIG. 1.

At operation 236, the memory component provides a notification to a processing device operatively coupled to the memory component upon programming the data to the different location in the memory component. The processing device can be, for example, memory sub-system controller 115 of FIG. 1. In some examples, the notification can include an indication of the different location in the memory component to which the data is programmed, as previously described in connection with FIG. 1.

Figure 3:
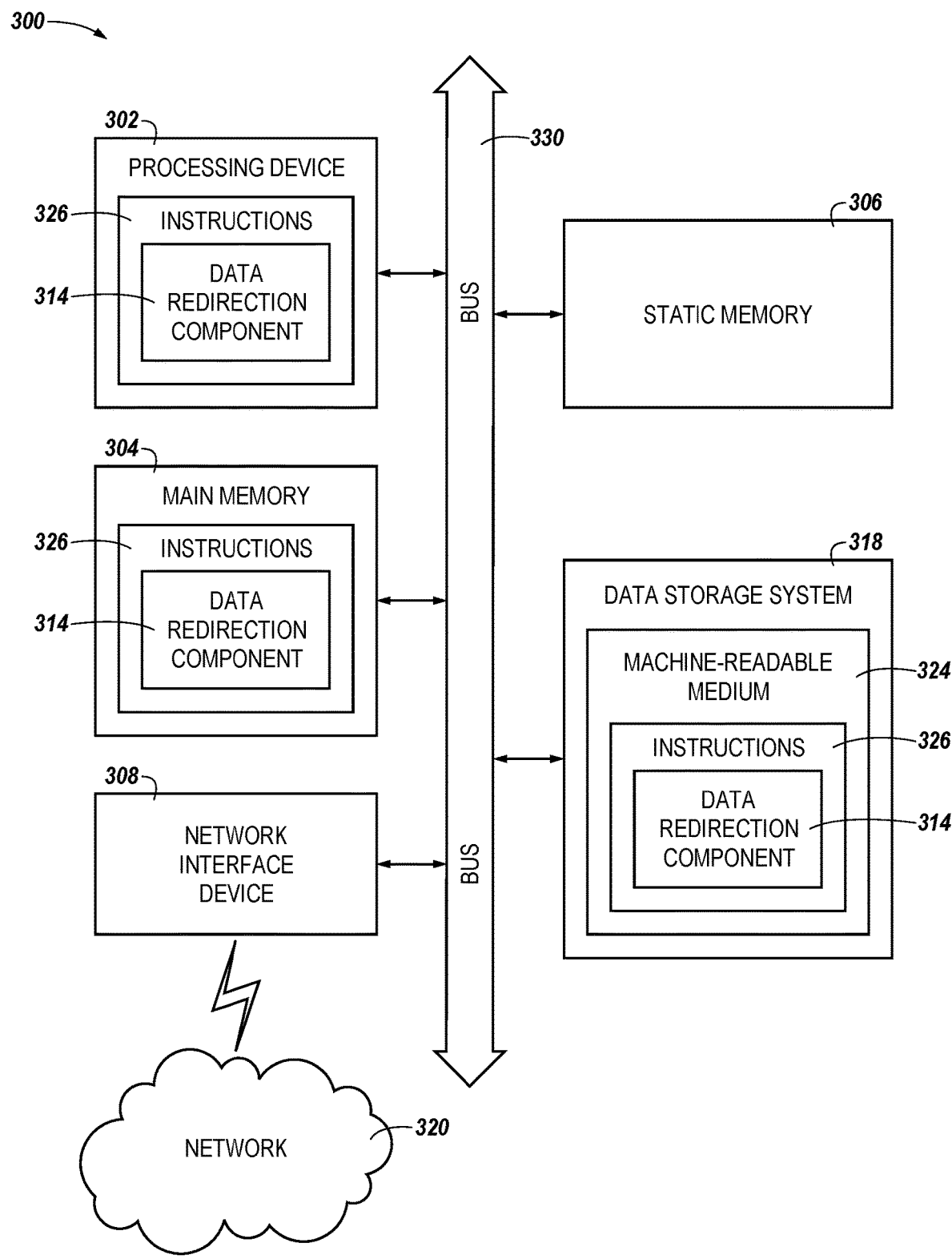
FIG. 3 is a block diagram of an example computer system in which embodiments of the present disclosure may operate.

FIG. 3 illustrates an example machine of a computer system 300 within which a set of instructions, for causing the machine to perform any one or more of the methodologies discussed herein, can be executed. In some embodiments, the computer system 300 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the data redirection component 114 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 300 includes a processing device 302, a main memory 304 (e.g., read-only memory (ROM), flash memory, dynamic random access memory (DRAM) such as synchronous DRAM (SDRAM) or RDRAM, etc.), a static memory 306 (e.g., flash memory, static random access memory (SRAM), etc.), and a data storage system 318, which communicate with each other via a bus 330.

Processing device 302 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 302 can also be one or more special-purpose processing devices such as an application specific integrated circuit (ASIC), a field programmable gate array (FPGA), a digital signal processor (DSP), network processor, or the like. The processing device 302 is configured to execute instructions 326 for performing the operations and steps discussed herein. The computer system 300 can further include a network interface device 308 to communicate over the network 320.

The data storage system 318 can include a machine-readable storage medium 324 (also known as a computer-readable medium) on which is stored one or more sets of instructions 326 or software embodying any one or more of the methodologies or functions described herein. The instructions 326 can also reside, completely or at least partially, within the main memory 304 and/or within the processing device 302 during execution thereof by the computer system 300, the main memory 304 and the processing device 302 also constituting machine-readable storage media. The machine-readable storage medium 324, data storage system 318, and/or main memory 304 can correspond to the memory sub-system 110 of FIG. 1.

In one embodiment, the instructions 326 include instructions to implement functionality corresponding to a data redirection component 314 (e.g., the data redirection component 114 of FIG. 1). While the machine-readable storage medium 324 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

As used herein, "a", "an", or "a number of" can refer to one or more of something, and "a plurality of" can refer to more than one of such things. For example, a memory device can refer to one or more memory devices, and a plurality of memory devices can refer to two or more memory devices.

The figures herein follow a numbering convention in which the first digit or digits correspond to the drawing figure number and the remaining digits identify an element or component in the drawing. Similar elements or components between different figures may be identified by the use of similar digits. For example, 114 may reference element "14" in FIG. 1, and a similar element may be referenced as 314 in FIG. 3.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
   a memory component; and
   a processing device, included in the memory component, to:
   determine an operation to program data to a location in the memory component has failed; and
   program the data to a different location in the memory component upon determining the operation has failed.

2. The system of claim 1, wherein:
   the processing device is further to receive the data to be programmed to the location in the memory component; and
   the memory component includes a buffer to store the data to be programmed to the location in the memory component.

3. The system of claim 1, wherein the processing device is to determine the operation to program the data to the location in the memory has failed based on an indication received from a processing device operatively coupled to the memory component.

4. The system of claim 3, wherein the indication comprises an indication that coupled access lines at the location in the memory component have failed.

5. The system of claim 3, wherein the indication comprises a status indicator.

6. The system of claim 3, wherein the indication comprises a flag.

7. The system of claim 1, wherein the processing device is to program the data to the different location in the memory component without moving the data through a processing device operatively coupled to the memory component.

8. The system of claim 1, wherein the processing device is to program the data to the different location in the memory component without interrupting any commands being performed by a processing device operatively coupled to the memory component.

9. A method, comprising:
   determining, by a memory component of a memory sub-system, an operation to program data to a location in the memory component has failed; and
   programming, by the memory component, the data to a different location in the memory component upon determining the operation has failed.

10. The method of claim 9, wherein programming the data to the different location in the memory component comprises retrieving, by the memory component, the data from a buffer.

11. The method of claim 10, wherein the buffer is included in the memory component.

12. The method of claim 9, wherein programming the data to the different location in the memory component comprises redirecting the data to the different location in the memory component.

13. The method of claim 9, wherein the method further comprises determining, by the memory component, the different location in the memory component to program the data to upon determining the operation has failed.

14. The method of claim 9, wherein the different location in the memory component to which the data is programmed is a spare area in the memory component.

15. A non-transitory computer-readable storage medium comprising instructions that, when executed by a processing device, cause the processing device to:
   receive data to be programmed to a location in a memory component of a memory subsystem;

determine an operation to program the data to the location in the memory component has failed; and program the data to a different location in the memory component.

16. The non-transitory computer-readable storage medium of claim 15, wherein the processing device is further to provide a notification that the data has been programmed to the different location in the memory component to a processing device operatively coupled to the memory component.

17. The non-transitory computer-readable storage medium of claim 15, wherein the processing device is further to provide an indication of the different location in the memory component to which the data has been programmed to a processing device operatively coupled to the memory component.

18. The non-transitory computer-readable storage medium of claim 15, wherein:

the location in the memory component is a first physical location; and the different location in the memory component is a second physical location that is different than the first physical location.

19. The non-transitory computer-readable storage medium of claim 15, wherein the processing device is further to determine the different location in the memory component to program the data to based on current operating parameters of the memory sub-system.

20. The non-transitory computer-readable storage medium of claim 15, wherein the processing device is further to determine the different location in the memory component to program the data to based on storage characteristics of the memory sub-system.

* * * * *